US012804929B2

(12) United States Patent
Miao et al.

(10) Patent No.: US 12,804,929 B2
(45) Date of Patent: Nov. 17, 2026

(54) SILICON CONTROLLED RECTIFIERS

(71) Applicant: GlobalFoundries U.S. Inc., Malta, NY (US)

(72) Inventors: Meng Miao, Williston, VT (US); Alain Loiseau, Williston, VT (US); Lin Lin, Reading, MA (US); Jing Wan, Essex Junction, VT (US); Wei Liang, South Burlington, VT (US); Anindya Nath, Essex Junction, VT (US); Sagar Premnath Karalkar, Singapore (SG); Souvick Mitra, Essex Junction, VT (US); Xunyu Li, Riverside, CA (US); Mengfu Di, Irvine, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 417 days.

(21) Appl. No.: 18/380,917

(22) Filed: Oct. 17, 2023

(65) Prior Publication Data

US 2025/0126817 A1 Apr. 17, 2025

(51) Int. Cl.
*H10D 18/80* (2025.01)
*H10D 89/60* (2025.01)

(52) U.S. Cl.
CPC ............. *H10D 18/80* (2025.01); *H10D 89/60* (2025.01)

(58) Field of Classification Search
CPC ...... H10D 18/80; H10D 89/60; H10D 62/126; H10D 89/713
See application file for complete search history.

(56) References Cited

U.S. PATENT DOCUMENTS

| | | | |
|---|---|---|---|
| 6,768,619 B2 | 7/2004 | Ker et al. | |
| 6,909,149 B2 | 6/2005 | Russ et al. | |
| 6,964,883 B2 | 11/2005 | Chang | |
| 8,049,247 B2 | 11/2011 | Tseng et al. | |
| 8,384,125 B2 | 2/2013 | Gauthier, Jr. et al. | |
| 8,680,620 B2 | 3/2014 | Salcedo et al. | |
| 8,796,731 B2 | 8/2014 | Abou-Khalil et al. | |
| 9,035,349 B2 | 5/2015 | Galy et al. | |
| 9,287,255 B2 | 3/2016 | Zhan et al. | |
| 9,318,481 B1 * | 4/2016 | Wang ..................... | H10D 8/041 |
| 10,361,185 B2 | 7/2019 | Zhan et al. | |

(Continued)

FOREIGN PATENT DOCUMENTS

| | | |
|---|---|---|
| CN | 102956632 | 3/2013 |
| CN | 110047828 | 7/2019 |
| CN | 114068525 | 2/2022 |

OTHER PUBLICATIONS

Specification and Drawings in the related U.S. Appl. No. 18/126,006, filed Mar. 24, 2023, 22 pages.

(Continued)

*Primary Examiner* — Changhyun Yi
(74) *Attorney, Agent, or Firm* — Andrew M. Calderon; Calderon Safran & Wright P.C.

(57) ABSTRACT

The present disclosure relates to semiconductor structures and, more particularly, to silicon controlled rectifiers and methods of manufacture. The structure includes: a plurality of wells of a first conductivity type; a well of a second conductivity type which is different than the first conductivity type; an intrinsic semiconductor region between the well and the plurality of wells; and contacts within the plurality of wells.

19 Claims, 4 Drawing Sheets

(56) References Cited

U.S. PATENT DOCUMENTS

| | | | | |
|---|---|---|---|---|
| 10,825,805 | B2 | 11/2020 | Mallikarjunaswamy | |
| 2005/0212051 | A1 | 9/2005 | Jozwiak et al. | |
| 2009/0206367 | A1 | 8/2009 | Gauthier, Jr. et al. | |
| 2011/0068366 | A1 | 3/2011 | Huang | |
| 2012/0098031 | A1 | 4/2012 | Wang | |
| 2014/0346563 | A1* | 11/2014 | Salcedo ............... | H10D 18/251 257/173 |
| 2015/0129030 | A1* | 5/2015 | Kapur ................... | H10F 77/211 438/98 |
| 2021/0335997 | A1 | 10/2021 | Zhu | |

OTHER PUBLICATIONS

Zhan et al., "High-Performance Bi-directional SCR Developed on a 0.13um SOI-based Smart Power Technology for Automotive Applications", IEEE, 2017 39th Electrical Overstress/Electrostatic Discharge Symposium (EOS/ESD), 7 pages.

Non-Final Office Action dated Jun. 30, 2025 in U.S. Appl. No. 18/126,006 25 pages.

Extended European Search Report and Opinion dated Jul. 5, 2024 in EP Application No. 24152744.9-1001, 8 pages.

* cited by examiner

SILICON CONTROLLED RECTIFIERS

BACKGROUND

The present disclosure relates to semiconductor structures and, more particularly, to silicon controlled rectifiers and methods of manufacture.

A silicon controlled rectifier (SCR) is a solid-state current-controlling device, which can be a unidirectional device (i.e., can conduct current only in one direction) or a bi-directional device. The An SCR is typically a three-terminal, three-junction, and four-layer semiconductor device that is used to perform switching functions in power circuits. That is, the SCR typically includes a switching configuration comprising p-n-p-n layers.

A bi-directional SCR may be used as a primary electrostatic discharge (ESD) protection in a radio frequency (RF) pad. In such devices, though, the depletion regions at the interface of the P-wells and N-wells shrink and expand with a biasing signal voltage. The capacitance of the bi-directional SCR will also fluctuate with the application of the biasing signal voltage. This fluctuation, though, causes large harmonic distortions.

SUMMARY

In an aspect of the disclosure, a structure comprises: a plurality of wells of a first conductivity type; a well of a second conductivity type which is different than the first conductivity type; an intrinsic semiconductor region between the well and the plurality of wells; and contacts within the plurality of wells.

In an aspect of the disclosure, a structure comprises: a plurality of P-wells; an N-well between the plurality of P-wells; an intrinsic semiconductor region between each of the P-wells and the N-well; a P+ region at an interface of each of the P-wells and the intrinsic semiconductor region; an N+ type region at an interface between the N-well and the intrinsic semiconductor; and contacts in the plurality of P-wells.

In an aspect of the disclosure, a method comprises: forming a plurality of wells of a first conductivity type; forming a well of a second conductivity type which is different than the first conductivity type; and forming an intrinsic semiconductor region between the well and the plurality of wells.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to silicon controlled rectifiers (SCR) and methods of manufacture. More specifically, the present disclosure relates to bi-directional SCRs. In embodiments, the bi-directional SCRs may be used in radio frequency electrostatic discharge protection circuits. Advantageously, the SCRs described in the present disclosure reduce harmonic distortions and reduce capacitance of the SCR in semiconductor-on-insulator (SOI) technologies.

In embodiments, the SCRs described herein comprise low-doped regions between P-wells and an N-well. In addition, highly doped P-type regions may be provided at the edges of the P-wells and highly doped N-type regions may be provided at the edges of the N-well. Contacts regions may be provided in the P-wells, which have higher doping concentrations than the highly doped regions. In embodiments, the contact regions may include P-type contact regions and N-type contact regions in different configurations.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
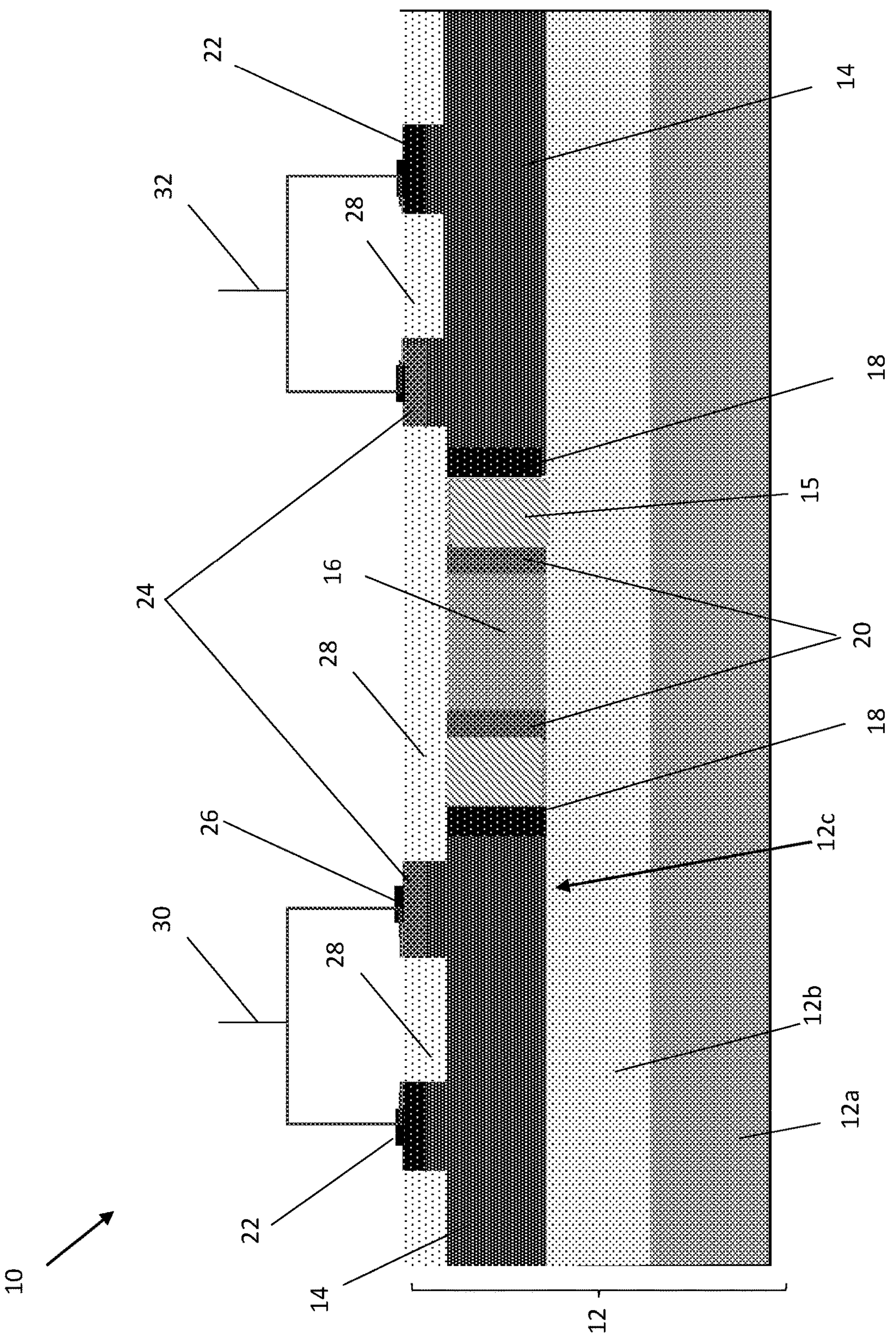
FIG. 1 shows a silicon controlled rectifier (SCR) device and respective fabrication processes in accordance with aspects of the present disclosure.

FIG. 1 shows a silicon controlled rectifier (SCR) device and respective fabrication processes in accordance with aspects of the present disclosure. In particular, the structure 10 includes a semiconductor substrate 12 which may be, for example, a semiconductor-on-insulator technology. The semiconductor-on-insulator technology may be used to reduce the overall capacitance of the SCR. From bottom to top, the semiconductor substrate 12 includes a handle substrate 12*a*, a buried insulator layer 12*b* and a top semiconductor layer 12*c*. The handle substrate 12*a* provides mechanical support to the buried insulator layer 12*b* and the top semiconductor layer 12*c*.

The handle substrate 12*a* and the top semiconductor layer 12*e* may include a semiconductor material such as, for example, Si, SiGe, SiC, SiGeC, a III-V compound semiconductor, an II-VI compound semiconductor or any combinations thereof. In specific embodiments, the handle substrate 12*a* may preferably be a P-type Si substrate. The buried insulator layer 12*b* may include a dielectric material such as silicon dioxide, silicon nitride, silicon oxynitride, boron nitride or a combination thereof. In one embodiment, the buried insulator layer 12*b* may be a buried oxide layer (BOX) formed by a deposition process, such as chemical vapor deposition (CVD), plasma enhanced chemical vapor deposition CVD (PECVD) or physical vapor deposition (PVD). In another embodiment, the buried insulator layer 12*b* may be formed using a thermal growth process, e.g., thermal oxidation, or by implanting oxygen atoms into a bulk semiconductor substrate and thereafter annealing the structure.

Typically, each of the handle substrate 12*a* and the top semiconductor layer 12*c* comprises a single crystalline semiconductor material, such as, for example, single crystalline silicon. The top semiconductor layer 12*c* may comprise any suitable crystallographic orientation (e.g., a (100), (110), (111), or (001) crystallographic orientation). The top semiconductor layer 12*c* may be partially depleted. The top semiconductor layer 12*c* can be formed by a deposition process, e.g., CVD or PECVD, or a smart cut process as is known in the art such that no further explanation is required for a complete understanding of the present invention.

Still referring to FIG. 1, the top semiconductor layer 12*c* includes P-wells 14 and an N-well 16. A highly doped P+ region 18 may be provided at the edge of the P-wells 14 and, preferably, at the interfaces between the P-wells 14 and a low-doped intrinsic layer 15. The low-doped intrinsic layer 15 may sit between the P-wells 14 and the N-well 16. In addition, a highly doped N+ region 20 may be provided in the N-well 16, and more specifically at the interface between the N-well 16 and the low-doped intrinsic layer 15. In any of the embodiments described herein, the width of the low-doped intrinsic layer 15 may be modified to tune the CV curves of the bi-directional SCR in order to adjust the harmonic distortions as described herein. The low-doped intrinsic layer 15 may also have a dopant concentration lower than a dopant concentration of the P-wells 14 and the N-well 16 and, in embodiments, may have the same dopant concentration as the handle substrate 12*a*.

In embodiments, the highly doped P+ regions 18 and highly doped N+ regions 20 have a higher dopant concentration than the P-wells 14 and the N-well 16. For example, the dopant concentration of the P-wells 14 and N-well 16 may be $1e^{18}$ $cm^{-3}$ to $5e^{18}$ $cm^{-3}$; whereas the dopant concentration of the highly doped P+ regions 18 and highly doped N+ regions 20 may be from about $1e^{19}$ $cm^{-3}$ to $5e^{19}$ $cm^{-3}$ or higher. It should be understood by those of skill in the art that other dopant concentrations are contemplated herein depending on the desired device performance of the SCR. The dopant concentration of the low-doped intrinsic layer 15 may be at the same concentration as the handle substrate 12*a*, e.g., $1e^{15}$ $cm^{-3}$ to $2e^{15}$ $cm^{-3}$.

Shallow trench isolation structures 28 may be provided in the N-well 16 and P-wells 14, in addition to over the highly doped P+ regions 18, highly doped N+ regions 20 and within or over the low-doped intrinsic layer 15. The shallow trench isolation structures 28 within the P-wells 14 may be used to isolate P+ contacts 22 and N+ contacts 24 within the P-wells 14. In this embodiment, the N+ contacts 24 within the P-wells 14 are closest to the N-well 16. In this embodiment, the top semiconductor layer 12*c* may be partially depleted semiconductor-on-insulator material.

The shallow trench isolation structures 28 can be formed by conventional lithography, etching and deposition methods known to those of skill in the art. For example, a resist formed over the top semiconductor layer 12*c* is exposed to energy (light) and developed utilizing a conventional resist developer to form a pattern (opening). An etching process with a selective chemistry, e.g., reactive ion etching (RIE), will be used to transfer the pattern from the photoresist layer to the top semiconductor layer 12*c* to form one or more trenches in the top semiconductor layer 12*c* through the openings of the resist. Following the resist removal by a conventional oxygen ashing process or other known stripants, the insulator material (e.g., $SiO_2$) can be deposited by any conventional deposition processes, e.g., chemical vapor deposition (CVD) processes. Any residual material on the surface of the top semiconductor layer 12*c* can be removed by conventional chemical mechanical polishing (CMP) processes.

In embodiments, the P+ wells 14, N+ wells 16, P+ contacts 22, N+ contacts 24, highly doped P+ regions 18, and highly doped N+ regions 20 may be formed by ion implantation processes. For example, the wells and contacts may be formed by introducing a concentration of a different dopant types in the top semiconductor layer 12*c*. In embodiments, respective patterned implantation masks may be used to define selected areas exposed for the implantations. For example, the implantation masks used to select the exposed area for P+ wells 14, N+ wells 16, P+ contacts 22, N+ contacts 24, highly doped P+ regions 18, and highly doped N+ regions 20 may be stripped after implantation, and before the implantation mask used to form other features. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The P+ wells 14, P+ contacts 22 and highly doped P+ regions 18 may be doped with p-type dopants, e.g., Boron (B), and the N+ wells, N+ contacts 24 and highly doped N+ regions 20 may be doped with n-type dopants, e.g., Arsenic (As), Phosphorus (P) and Sb, among other suitable examples.

FIG. 1 further shows silicide contacts 26 on the P+ contacts 22 and N+ contacts 24 within the P-wells 14. As should be understood by those of skill in the art, the silicide process begins with deposition of a thin transition metal layer, e.g., nickel, cobalt or titanium, over fully formed and patterned semiconductor devices (e.g., P+ contacts 22 and N+ contacts 24). After deposition of the material, the structure is heated allowing the transition metal to react with exposed silicon (or other semiconductor material as described herein) in the active regions of the semiconductor device (e.g., P+ contacts 22 and N+ contacts 24) forming a low-resistance transition metal silicide. Following the reaction, any remaining transition metal is removed by chemical etching, leaving silicide contacts 26.

Terminals 30, 32 may be formed to the P+ contacts 22 and N+ contacts 24 and, more specifically, to the silicide contacts 26 on the P+ contacts 22 and N+ contacts 24. The terminals 30, 32 may be any back end of the line (BEOL) wiring structures known to those of skill in the art such that no further explanation is required for a complete understanding of the present disclosure. For example, the terminals 30, 32 may be aluminum, tungsten, etc. formed in an interlevel dielectric material using conventional CMOS processes.

Figure 2:
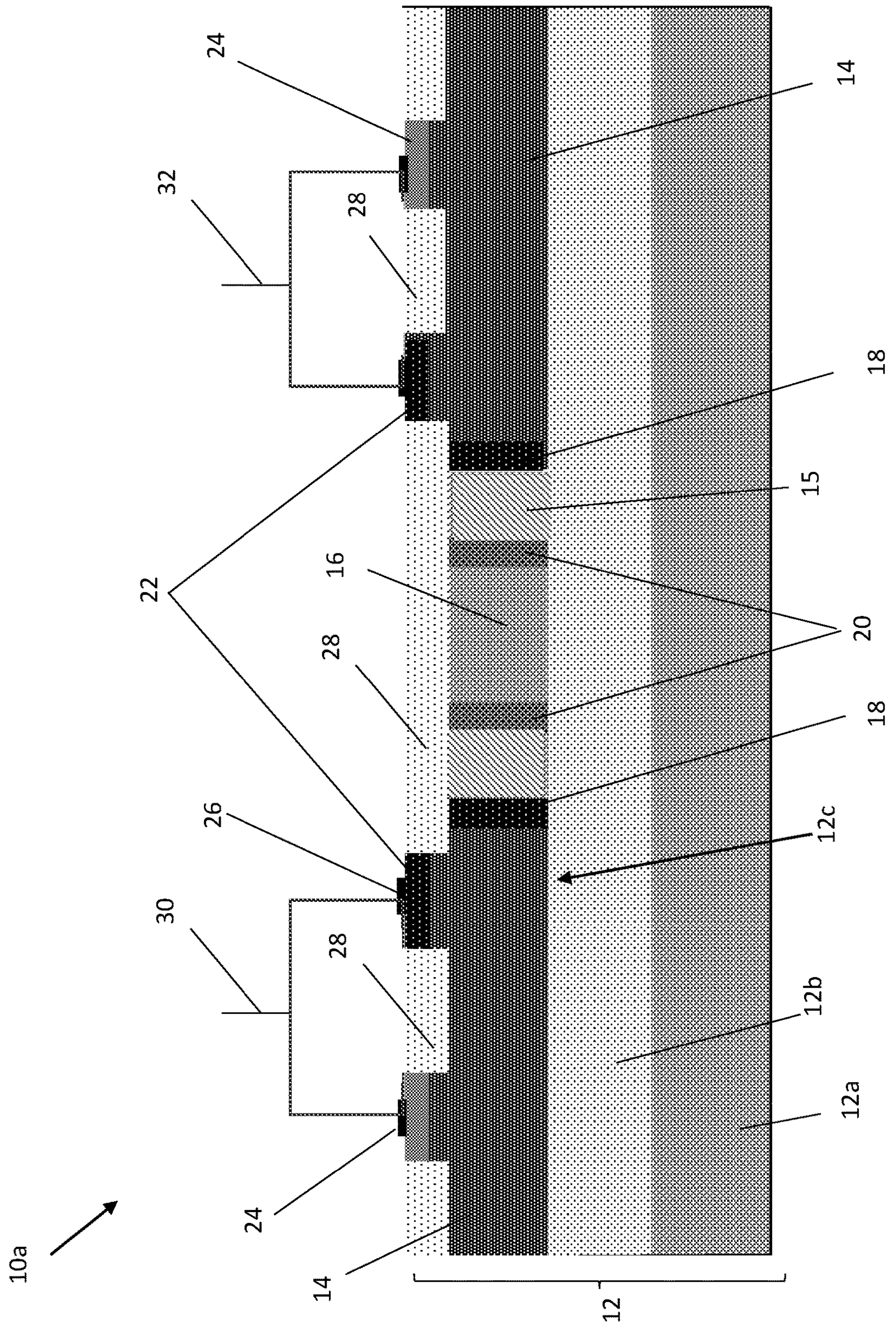
FIG. 2 shows an SCR device in accordance with additional aspects of the present disclosure.

FIG. 2 shows an SCR device in accordance with additional aspects of the present disclosure. In this structure 10*a*, the P+ contacts 22 within the P-wells 14 are closer to the N-well 16 than the N+ contacts 24. The remaining features are similar to that of the structure 10 of FIG. 1.

Figure 3:
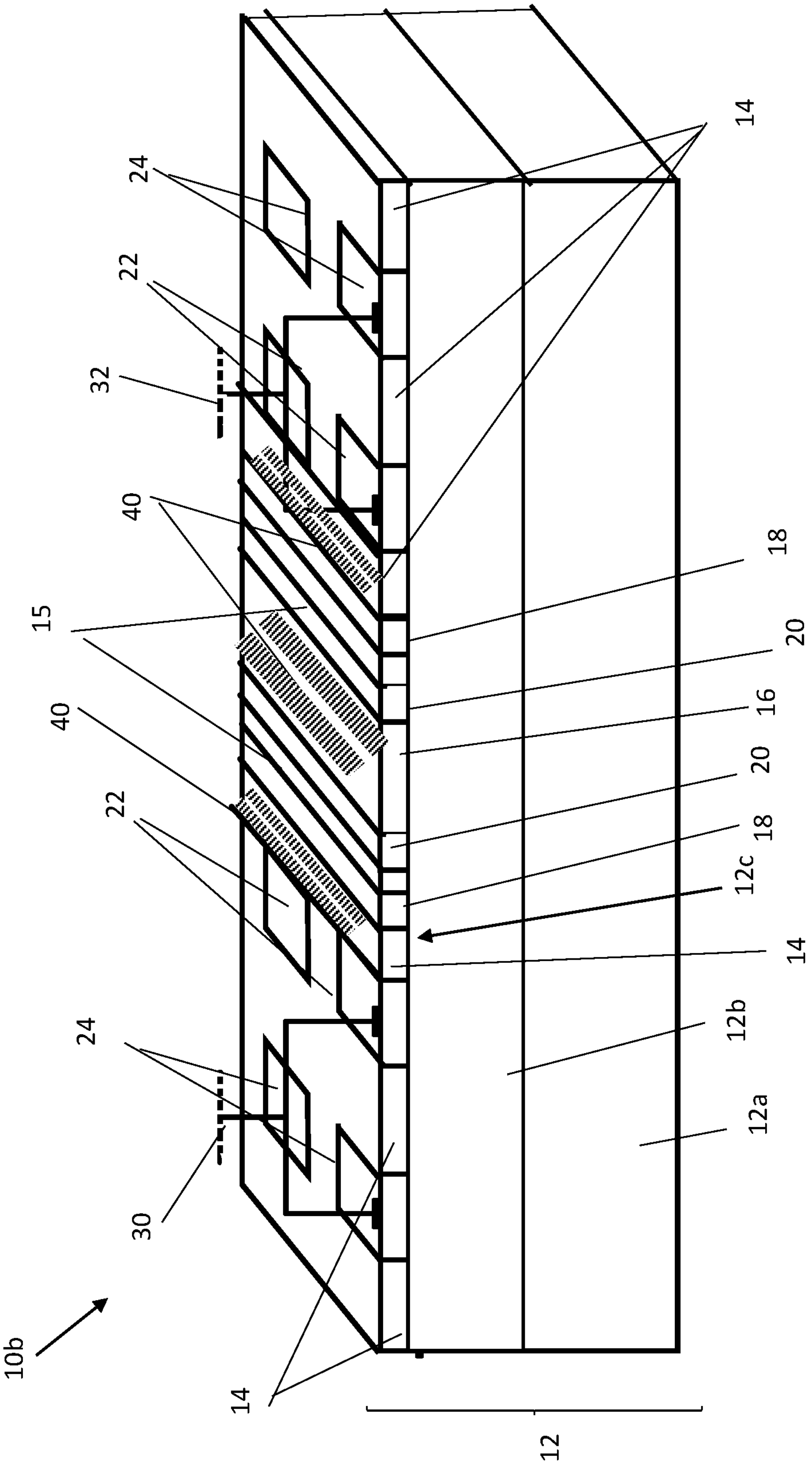
FIG. 3 shows an SCR device in accordance with further aspects of the present disclosure.

FIG. 3 shows an SCR device in accordance with additional aspects of the present disclosure. In the structure 10*b*, the P+ contacts 22 and N+ contacts 24 are separated in the P-wells 14 as separate islands. In this embodiment, the top semiconductor layer 12*c* may be fully depleted semiconductor-on-insulator material. Also, the shallow trench isolation structures may be eliminated between the P+ contacts 22 and N+ contacts 24; although isolation structures may be provided above the P-wells 14. In further embodiments, gate structures 40 may be provided over the P-wells 14, between the separate islands 22, 24. The gate structures 40 may allow for self-aligned implant regions, e.g., highly doped P+ regions 18, and highly doped N+ regions 20. The remaining features are similar to that of the structure 10 of FIG. 1.

Figure 4:
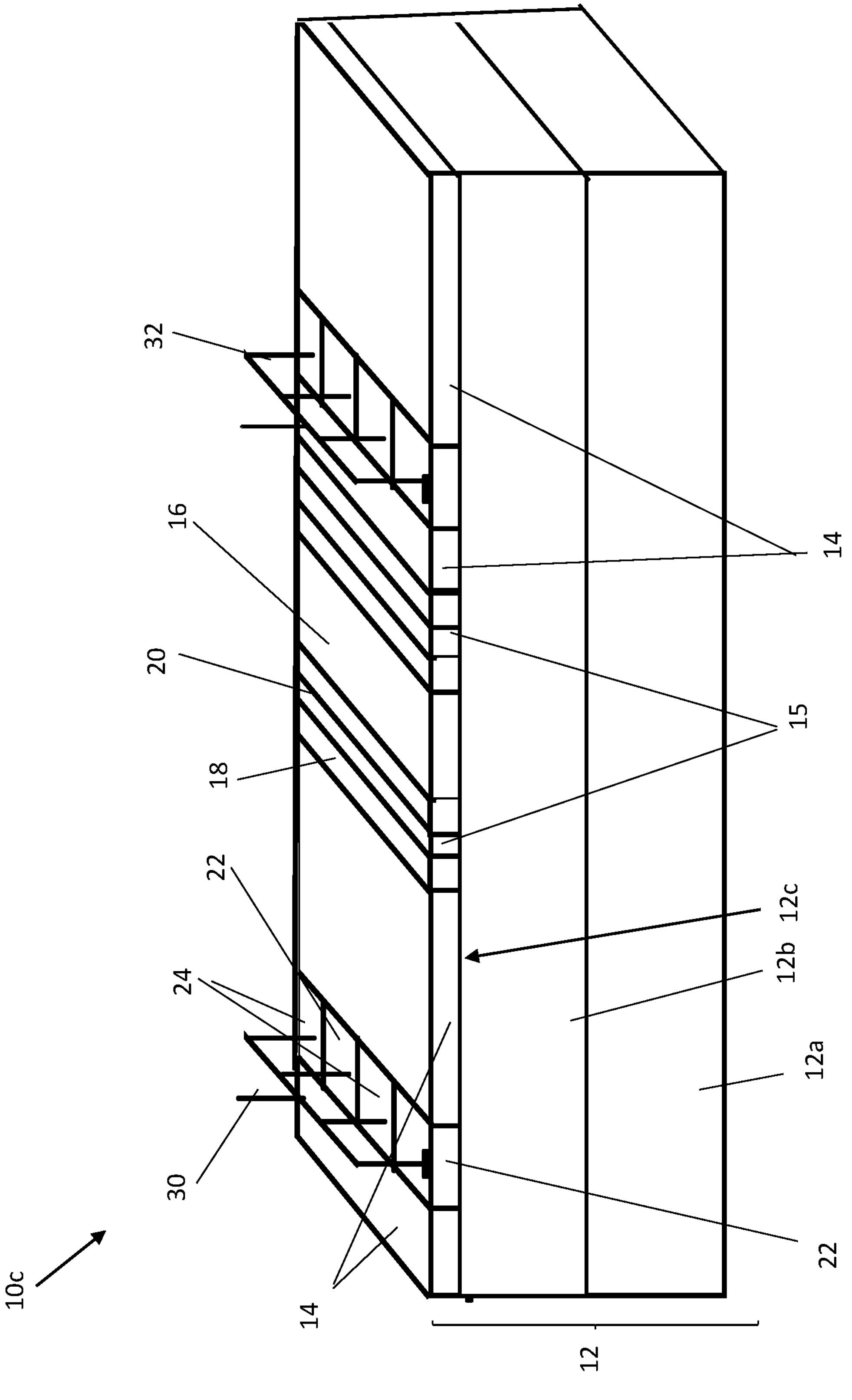
FIG. 4 shows an SCR device in accordance with yet additional aspects of the present disclosure.

FIG. 4 shows an SCR device in accordance with additional aspects of the present disclosure. In the structure 10*c*, the P+ contacts 22 and N+ contacts 24 alternate and are in series in the P-wells 14. In this embodiment, the shallow trench isolation structures may be eliminated between the P+ contacts 22 and N+ contacts 24. In addition, the terminals 32 and 34 may be connected to each of the P+ contacts 22 and N+ contacts 24, in the series connection. The top semiconductor layer 12*c* may also be fully depleted semiconductor-on-insulator material. The remaining features are similar to that of the structure 10*b* of FIG. 3.

The bi-directional silicon controlled rectifiers can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:

a plurality of wells of a first conductivity type;

a well of a second conductivity type which is different than the first conductivity type;

an intrinsic semiconductor region between the well of the second conductivity type and the plurality of wells of the first conductivity type; and contacts within the plurality of wells of the first conductivity type, wherein the plurality of wells of the first conductivity type, the well of the second conductivity type and the intrinsic semiconductor region comprise a top semiconductor layer of a semiconductor-on-insulator substrate.

2. The structure of claim 1, wherein the intrinsic semiconductor region has a dopant concentration lower than the plurality of wells of the first conductivity type and the well of the second conductivity type.

3. The structure of claim 1, wherein the plurality of wells of the first conductivity type comprise P-wells and the well of the second conductivity type comprises an N-well.

4. The structure of claim 1, further comprising a highly-doped region of the first conductivity type at an interface between the plurality of wells of the first conductivity type and the intrinsic semiconductor region.

5. The structure of claim 4, wherein the highly-doped region of the first conductivity type comprises a higher dopant concentration than the plurality of wells of the first conductivity type.

6. The structure of claim 1, wherein the contacts comprise P+ contacts and N+ contacts, wherein the P+ contacts are closer to the intrinsic semiconductor region than the N+ contacts, and further comprising shallow trench isolation structures separating the P+ contacts and the N+ contacts.

7. The structure of claim 1, wherein the contacts comprise P+ contacts and N+ contacts, wherein the N+ contacts are closer to the intrinsic semiconductor region than the P+ contacts, and further comprising shallow trench isolation structures separating the P+ contacts and the N+ contacts.

8. The structure of claim 1, wherein the contacts comprise P+ contacts and N+ contacts alternating and in series in the plurality of wells, and the top semiconductor layer comprises a fully depleted semiconductor on insulator layer.

9. The structure of claim 1, wherein the contacts comprise P+ contacts and N+ contacts alternating islands in the plurality of wells, and the top semiconductor layer comprises a fully depleted semiconductor on insulator layer.

10. A structure comprising:

a plurality of wells of a first conductivity type;

a well of a second conductivity type which is different than the first conductivity type;

an intrinsic semiconductor region between the well of the second conductivity type and the plurality of wells of the first conductivity type;

contacts within the plurality of wells of the first conductivity type;

a highly-doped region of the first conductivity type at an interface between the plurality of wells of the first conductivity type and the intrinsic semiconductor region; and a highly-doped region of the second conductivity type at an interface between the well of the second conductivity type and the intrinsic semiconductor region.

11. The structure of claim 10, wherein the highly-doped region of the second conductivity type comprises a higher dopant concentration than the well of the second conductivity type.

12. A structure comprising:

a plurality of P-wells;

an N-well between the plurality of P-wells;

an intrinsic semiconductor region between each of the P-wells and the N-well;

a P+ region at an interface of each of the P-wells and the intrinsic semiconductor region;

an N+ type region at an interface between the N-well and the intrinsic semiconductor; and contacts in the plurality of P-wells.

13. The structure of claim 12, wherein the contacts comprise P+ contacts and N+ contacts, wherein the P+ contacts are closer to the intrinsic semiconductor region than the N+ contacts, and further comprising shallow trench isolation structures separating the P+ contacts and the N+ contacts.

14. The structure of claim 12, wherein the contacts comprise P+ contacts and N+ contacts, wherein the N+ contacts are closer to the intrinsic semiconductor region than the P+ contacts, and further comprising shallow trench isolation structures separating the P+ contacts and the N+ contacts.

15. The structure of claim 12, wherein the contacts comprise P+ contacts and N+ contacts alternating and in series in the plurality of P-wells.

16. The structure of claim 15, wherein N-well and the plurality of P-wells are provided in a fully depleted semiconductor layer.

17. The structure of claim 12, wherein the intrinsic semiconductor region comprises a doped region which comprises a lower dopant concentration than the N-well and the plurality of P-wells.

18. The structure of claim 12, further comprising gate structures adjacent to the P+ region and the N+ type region.

19. A method comprising:

forming a plurality of wells of a first conductivity type;

forming a well of a second conductivity type which is different than the first conductivity type; and forming an intrinsic semiconductor region between the well and the plurality of wells, wherein the plurality of wells of the first conductivity type, the well of the second conductivity type and the intrinsic semiconductor region comprise a top semiconductor layer of a semiconductor-on-insulator substrate.

* * * * *